(12) United States Patent
Cho et al.

(10) Patent No.: US 10,727,324 B2
(45) Date of Patent: Jul. 28, 2020

(54) BIPOLAR JUNCTION TRANSISTOR

(71) Applicant: UNITED MICROELECTRONICS CORP., Hsin-Chu (TW)

(72) Inventors: Sheng Cho, Hsinchu County (TW); Chen-Wei Pan, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/406,003

(22) Filed: May 7, 2019

(65) Prior Publication Data

US 2019/0267478 A1  Aug. 29, 2019

Related U.S. Application Data

(62) Division of application No. 15/614,636, filed on Jun. 6, 2017, now Pat. No. 10,431,674.

(30) Foreign Application Priority Data

May 5, 2017 (CN) .......................... 2017 1 0311951

(51) Int. Cl.
*H01L 29/73* (2006.01)
*H01L 29/08* (2006.01)
*H01L 29/06* (2006.01)
*H01L 29/735* (2006.01)
*H01L 29/732* (2006.01)

(52) U.S. Cl.
CPC .......... *H01L 29/73* (2013.01); *H01L 29/0653* (2013.01); *H01L 29/0692* (2013.01); *H01L 29/0813* (2013.01); *H01L 29/0821* (2013.01); *H01L 29/735* (2013.01); *H01L 29/732* (2013.01)

(58) Field of Classification Search
CPC . H01L 29/73; H01L 29/0653; H01L 29/0692; H01L 29/0813; H01L 29/0821; H01L 29/735; H01L 29/732
USPC .......................................................... 257/592
See application file for complete search history.

(56) References Cited

U.S. PATENT DOCUMENTS

| | | |
|---|---|---|
| 5,786,622 A | 7/1998 | Ronkainen |
| 6,703,685 B2 | 3/2004 | Ahmed et al. |
| 6,828,650 B2 | 12/2004 | de Fresart et al. |
| 7,569,448 B2 | 8/2009 | Kamiya et al. |
| 8,125,051 B2 | 2/2012 | Chuang et al. |
| 8,159,048 B2 | 4/2012 | Apel et al. |
| 9,263,336 B2 | 2/2016 | BrightSky et al. |
| 9,368,594 B2 | 6/2016 | Chang et al. |
| 2008/0087918 A1 | 4/2008 | Arendt |
| 2008/0224266 A1 | 9/2008 | Chang et al. |
| 2010/0213575 A1 | 8/2010 | Chen |
| 2012/0049282 A1* | 3/2012 | Chen .................. H01L 27/1211 257/347 |

(Continued)

FOREIGN PATENT DOCUMENTS

CN    106409890 A  *  2/2017

*Primary Examiner* — Tong-Ho Kim
(74) *Attorney, Agent, or Firm* — Winston Hsu

(57) ABSTRACT

A bipolar junction transistor includes: an emitter region; a base region; and a collector region, wherein each of the emitter region, the base region, and the collector region comprises fin-shaped structures. Preferably, the emitter region, the base region, and the collector region are disposed along a first direction and the fin-shaped structures are disposed along a second direction, in which the first direction is orthogonal to the second direction.

8 Claims, 4 Drawing Sheets

(56) References Cited

U.S. PATENT DOCUMENTS

| | | |
|---|---|---|
| 2012/0319243 A1 | 12/2012 | Fan et al. |
| 2015/0123246 A1 | 5/2015 | Hu |
| 2015/0236116 A1* | 8/2015 | Chang ................. H01L 29/6625 438/338 |
| 2015/0287716 A1 | 10/2015 | Babcock |

* cited by examiner

BIPOLAR JUNCTION TRANSISTOR

CROSS REFERENCE TO RELATED APPLICATIONS

This application is a division of U.S. application Ser. No. 15/614,636 filed Jun. 6, 2017, and incorporated herein by reference in its entirety.

BACKGROUND OF THE INVENTION

1. Field of the Invention

The invention relates to a bipolar junction transistor (BJT) having low emitter region area and low base region area.

2. Description of the Prior Art

As is well known to those of skill in the art, a BJT device is a three-terminal device that essentially including an emitter, a base and a collector. In normal operation, the emitter-base junction will be forward biased while the collector-base junction reversed biased by externally applied voltages, and the device is driven in a forward active mode. Furthermore, BJT device can be manufactured using complementary metal-oxide-semiconductor (CMOS) process, and therefore plays an important role in band-gap voltage reference circuits. Accordingly, BJT device often serves as switching device and is often used in high-voltage, high-frequency, and/or high-power applications.

Nevertheless, the design of current BJT device is still insufficient in that the overall large area of the base region and the collector region affects the performance of the device substantially. Hence, how to resolve this issue has become an important task in this field.

SUMMARY OF THE INVENTION

According to an embodiment of the present invention, a bipolar junction transistor preferably includes: an emitter region; a base region; and a collector region, in which an edge of the emitter region is aligned with an edge of the base region. Preferably, an edge of the base region is aligned with an edge of the collector region, the edge of the emitter region is aligned with the edges of the base region and the collector region, and the widths of the emitter region, the base region, and the collector region are equivalent. According to a top view of the bipolar junction transistor, each of the base region and the collector region includes a rectangle.

According to another aspect of the present invention, a bipolar junction transistor includes: an emitter region; a base region; and a collector region, wherein each of the emitter region, the base region, and the collector region comprises fin-shaped structures. Preferably, the emitter region, the base region, and the collector region are disposed along a first direction and the fin-shaped structures are disposed along a second direction, in which the first direction is orthogonal to the second direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
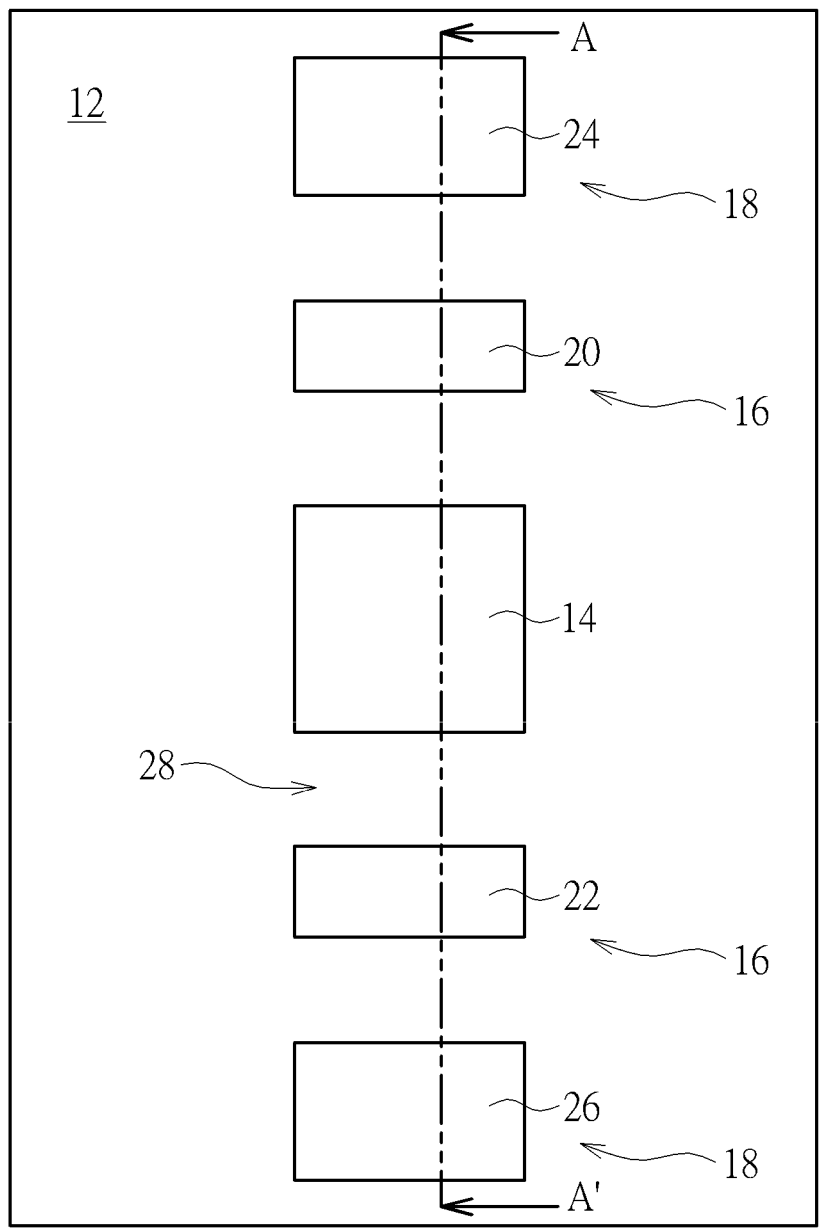
FIG. 1 illustrates a structural view of a BJT according to a first embodiment of the present invention.
Figure 2:
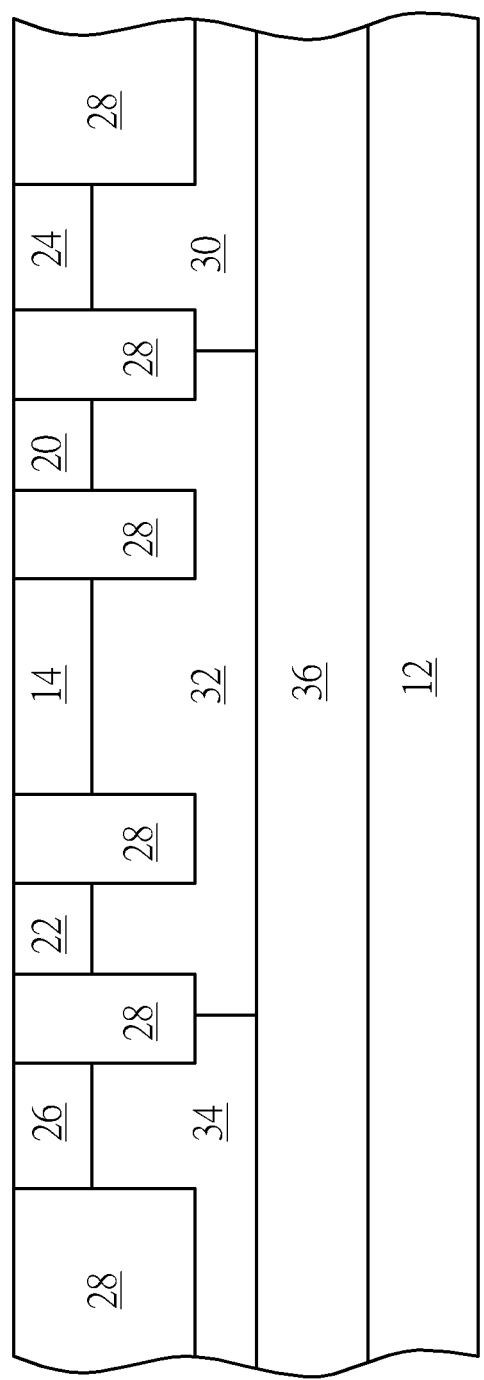
FIG. 2 illustrates a cross-sectional view of FIG. 1 along the sectional line AA'.

Referring to FIGS. 1-2, FIGS. 1-2 illustrate structural views of a bipolar junction transistor (BJT) according to a first embodiment of the present invention, in which FIG. 1 illustrates a top view of the BJT and FIG. 2 illustrates a cross-sectional view of FIG. 1 along the sectional line AA'. As shown in FIGS. 1-2, the BJT preferably includes an emitter region 14, two base regions 16 and two collector regions 18 disposed on a substrate 12. In this embodiment, the substrate 12 could be a semiconductor substrate including but not limited to for example a silicon substrate, an epitaxial substrate, a SiC substrate, or a silicon-on-insulator (SOI) substrate.

In this embodiment, a shallow trench isolation (STI) 28 is disposed in the substrate 12 to define and separate the emitter region 14, base regions 16, and collector regions 18. As shown in FIG. 1, the BJT of this embodiment includes an emitter region 14 disposed in the center region, two base regions 16 including a first base region 20 and a second base region 22 disposed above and below the emitter region 14 respectively, and two collector regions 18 including a first collector region 24 and a second collector region 26 disposed above the first base region 20 and below the second base region 22 respectively. Preferably, the emitter region 14, base regions 16, and collector regions 18 are arranged according to an alternating manner. For instance, the first collector region 24, the first base region 20, the emitter region 14, the second base region 22, and the second collector region 26 are disposed or arranged from top to bottom along a first direction (such as Y-direction) according to a straight line.

Viewing from a top-view perspective as shown in FIG. 1, the emitter region 14, two base regions 16, and two collector regions 18 are all rectangular, in which the emitter region 14 disposed in the center is preferably square-shaped and the two base regions 16 and two collector regions 18 are both rectangular shaped. Among which, the first base region 20 and the second base region 22 are rectangles having smaller surface areas while the first collector region 24 and the second collector region 26 are rectangles having greater surface areas. Moreover, the first collector region 24, the first base region 20, the emitter region 14, the second base region 22, and the second collector region 26 all share equal widths, in which the width of each region is preferably measured by the distance extending along the X-direction. Since all of the above regions share equal widths, the left sidewalls and right sidewalls of the regions 24, 20, 14, 22, and 26 are also aligning each other along the Y-direction.

In this embodiment, the BJT is preferably constituted by a NPN type transistor, in which the first collector region 24 includes a N+ region, the first base region 20 includes a P+ region, the emitter region 14 includes a N+ region, the second base region 22 includes another P+ region, and the second collector region 26 includes another N+ region.

A n-well 30 is disposed in the substrate 12 directly under the first collector region 24, a p-well 32 is disposed directly under the first base region 20, the emitter region 14 and the second base region 22, another n-well 34 is disposed in the substrate 12 directly under the second collector region 26, and a deep n-well 36 is disposed in the substrate 12 under the n-well 30, p-well 32, and n-well 34.

The emitter region 14 is preferably a highly doped region, which preferably emits electrons from the p-well 32 into base regions 16. Hence even though both the emitter region 14 and the two collector regions 18 are made of n-type doped regions, the n+ concentration of the emitter region 14 is preferably greater than the n+ concentration of the first collector region 24 and second collector region 26.

Viewing from an operating perspective, an NPN type BJT could be viewed as a combination of two diodes having shared anodes. Under regular operation mode, emitter junction (such as the PN junction between the base regions 16 and emitter regions 14) is under forward bias state while the collector junction (such as the PN junction between base regions 16 and collector regions 18) is under reverse bias state. When no external voltage is applied, the electron concentration of the n-type region in emitter junction is greater than the electron concentration of the p-type region, which induces electrons to diffuse to the p-type region. Similarly, part of the holes in the p-type region also diffuses to the n-type region. This forms a depletion layer above the emitter junction and generates an inner electric field having a direction pointing from n-type region to the p-type region. This electrical field blocks the aforementioned diffusion process to move forward thereby reaching a dynamic balance. If a forward bias were applied to the emitter junction at this moment, the balance between the carrier movement and the inner electrical field would be broken so that electrons would be injected into the base regions.

It should be noted that even though the aforementioned embodiment pertains to be a NPN type BJT, according to an embodiment of the present invention, it would also be desirable to apply the above BJT structure to PNP type transistor and in such instance, the conductive type of the all the emitter region 14, two base regions 16, two collector regions 18, and all the well regions within the substrate 12 would all be reversed to form a PNP-based BJT, which is also within the scope of the present invention.

Figure 3:
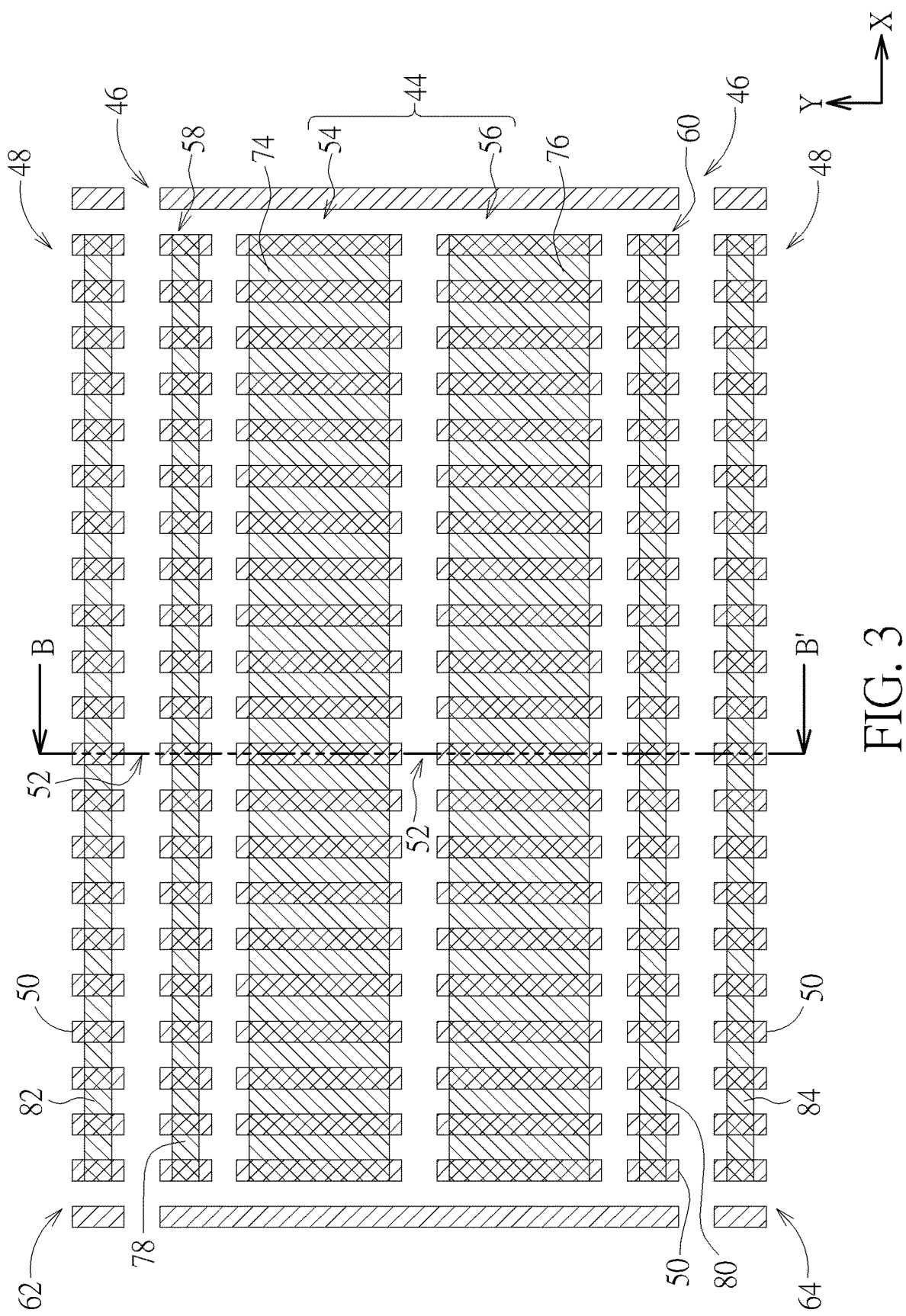
FIG. 3 illustrates a structural view of a BJT according to a second embodiment of the present invention.
Figure 4:
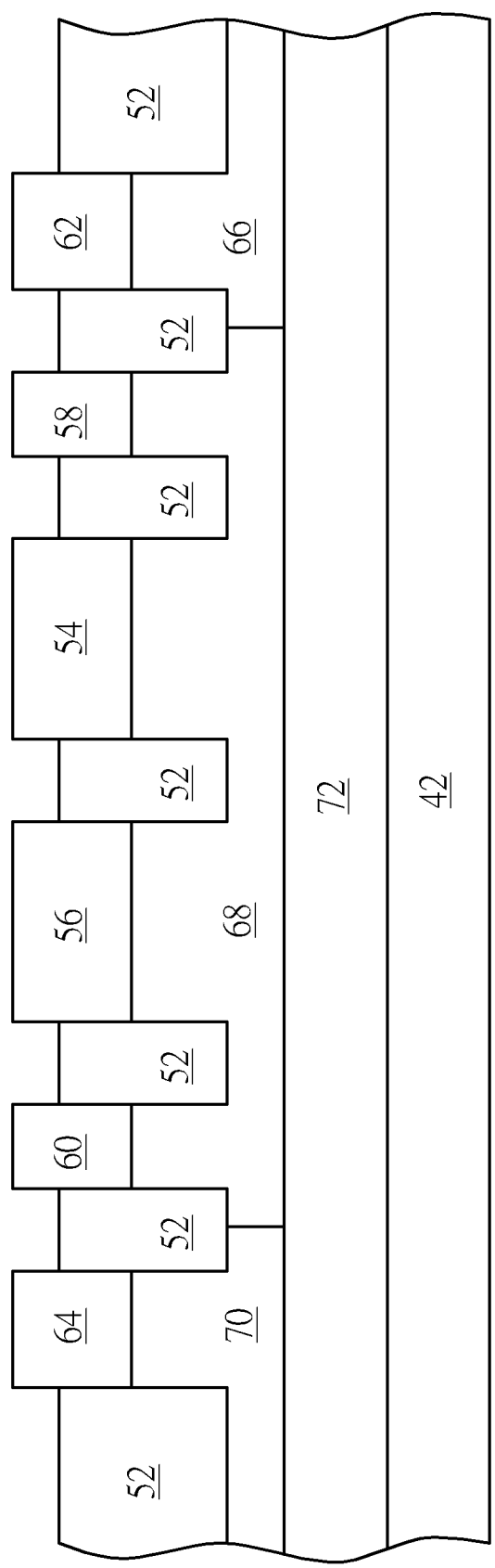
FIG. 4 illustrates a cross-sectional view of FIG. 3 along the sectional line BB'.

Referring to FIGS. 3-4, FIGS. 3-4 illustrate structural views of a BJT according to a second embodiment of the present invention, in which FIG. 3 illustrates a top view of the BJT and FIG. 4 illustrates a cross-sectional view of FIG. 3 along the sectional line BB'. As shown in FIGS. 3-4, the BJT preferably includes two emitter regions 44, two base regions 46, and two collector regions 48 disposed on the substrate 42, in which each of the emitter regions 44, base regions 46, and collector regions 48 includes at least a fin-shaped structure 50. As shown in FIG. 3, each of the emitter regions 44, base regions 46, and collector regions 48 includes multiple fin-shaped structures 50 and the plurality of fin-shaped structures 50 in each region could be electrically connected to each other through a contact plug. Viewing from a more detailed perspective, the emitter regions 44 are electrically connected to the fin-shaped structures 50 through contact plugs 74 and 76, the base regions 46 are electrically connected to the fin-shaped structures 50 through contact plugs 78 and 80, and the collector regions 48 are electrically connected to the fin-shaped structures 50 through contact plugs 82 and 84.

Overall, if the fin-shaped structures 50 were electrically connected by the aforementioned contact plugs, all the emitter regions 44, base regions 46, and collector regions 48 along with multiple fin-shaped structures 50 would constitute a single BJT altogether. Conversely, if no contact plug were formed, the present embodiment preferably includes multiple BJTs, in which the emitter region 44, base region 46, and collector region 46 of each BJT are connected or communicating to each other through a single fin-shaped structure 50. Similar to the aforementioned embodiment, the substrate 42 could be a semiconductor substrate including but not limited to for example a silicon substrate, an epitaxial substrate, a SiC substrate, or a silicon-on-insulator (SOI) substrate.

In this embodiment, the fin-shaped structure 50 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 50 could also be obtained by first forming a patterned mask (not shown) on the substrate 42, and through an etching process, the pattern of the patterned mask is transferred to the substrate 42 to form the fin-shaped structures 50. Moreover, the formation of the fin-shaped structures 50 could also be accomplished by first forming a patterned hard mask (not shown) on the substrate 42, and a semiconductor layer composed of silicon germanium is grown from the substrate 42 through exposed patterned hard mask via selective epitaxial growth process to form the corresponding fin-shaped structures 50. These approaches for forming fin-shaped structures 50 are all within the scope of the present invention.

In this embodiment, a shallow trench isolation (STI) 52 is disposed in the substrate 42 to define and separate the emitter regions 44, base regions 46, and collector regions 48. As shown in FIG. 3, the BJT of this embodiment includes two emitter regions 44 including a first emitter region 54 and a second emitter region 56 disposed in the center region, two base regions 46 including a first base region 58 and a second base region 60 disposed above and below the first emitter region 54 and second emitter region 56 respectively, and two collector regions 48 including a first collector region 62 and a second collector region 64 disposed above the first base region 58 and below the second base region 60 respectively. Preferably, the emitter region 44, base regions 46, and collector regions 48 are arranged according to an alternating manner. For instance, the first collector region 62, the first base region 58, the first emitter region 54, the second emitter region 56, the second base region 60, and the second collector region 64 are disposed or arranged from top to bottom along a first direction (such as Y-direction) according to a straight line.

Viewing from a top-view perspective as shown in FIG. 3, the two emitter regions 44, two base regions 46, and two collector regions 48 are all rectangular, in which the area of each of the first emitter region 54 and the second emitter region 56 is greater than the area of each of the first base region 58 and the second base region 60 and also greater than the area of each of the first collector region 62 and the second collector region 64. The area of each of the first collector region 62 and the second collector region 64 on the other hand could be substantially equal to or slightly greater than the area of each of the first base region 58 and the second base region 60.

Moreover, the first collector region 62, the first base region 58, the first emitter region 54, the second emitter region 56, the second base region 60, and the second collector region 64 all share equal widths, in which the width of each region is preferably measured by the distance extending along the X-direction. Since all of the above regions share equal widths, the left edges or sidewalls and right edges or sidewalls of the regions 62, 58, 54, 56, 60, and 64 are also aligning to each other along the Y-direction.

In this embodiment, the BJT is preferably constituted by a NPN type transistor, in which the first collector region 62 includes a N+ region disposed in the fin-shaped structures 50, the first base region 58 includes a P+ region disposed in the fin-shaped structures 50, the first emitter region 54 includes a N+ region disposed in the fin-shaped structures 50, the second emitter region 56 includes a N+ region disposed in the fin-shaped structures 50, the second base region 60 includes another P+ region disposed in the fin-shaped structures 50, and the second collector region 64 includes another N+ region disposed in the fin-shaped structures 50.

Preferably, STI 52 is disposed between the fin-shaped structures 50 on the first collector region 62 and the fin-shaped structures 50 on the first base region 58 so that the fin-shaped structures 50 on both regions 62 and 58 not contacting each other directly. Similarly, STI 52 is disposed between the fin-shaped structures 50 on the first base region 58 and the fin-shaped structures 50 on the first emitter region 54 so that the fin-shaped structures 50 on both regions 58 and 54 not contacting each other directly; STI 52 is disposed between the fin-shaped structures 50 on the first emitter region 54 and the fin-shaped structures 50 on the second emitter region 56 so that the fin-shaped structures 50 on both regions 54 and 56 not contacting each other directly; STI 52 is disposed between the fin-shaped structures 50 on the second emitter region 56 and the fin-shaped structures 50 on the second base region 60 so that the fin-shaped structures 50 on both regions 56 and 60 not contacting each other directly; and STI 52 is disposed between the fin-shaped structures 50 on the second base region 60 and the fin-shaped structures 50 on the second collector region 64 so that the fin-shaped structures 50 on both regions 62 and 64 not contacting each other directly.

The emitter region 44 is preferably a highly doped region, which preferably transmits electrons into base regions 62. Hence even though both the two emitter regions 44 and the two collector regions 48 are made of n-type doped regions, the n+ concentration of each of the emitter region 44 is preferably greater than the n+ concentration of the each of the collector regions 48.

Moreover, a n-well 66 is disposed in the substrate 42 directly under the first collector region 62, a p-well 68 is disposed directly under the first base region 58, the first emitter region 54, the second emitter region 56, and the second base region 60, another n-well 70 is disposed in the substrate 42 directly under the second collector region 64, and a deep n-well 72 is disposed in the substrate 42 under the n-well 66, p-well 68, and n-well 70.

It should be noted that even though the emitter region 44 is divided into portions including a first emitter region 54 and second emitter region 56 in this embodiment, according to an embodiment, of the present invention, it would also be desirable to combine the first emitter region 54 and the second emitter region 56 so that only a single emitter region is disposed between the first base region 58 and the second base region 60, which is also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bipolar junction transistor, comprising:
an emitter region;
a base region; and
a collector region, wherein each of the emitter region, the base region, and the collector region comprises fin-shaped structures, each of the emitter region, the base region, and the collector region comprise a short side and a long side, an edge of the short side of the emitter region is aligned with and without overlapping an edge of the short side of the base region and an edge of the short side of the collector region according to a top view, and a length of the long side of the emitter region is same as a length of the long side of the base region and a length of the long side of the collector region.

2. The bipolar junction transistor of claim 1, wherein the emitter region, the base region, and the collector region are disposed along a first direction and the fin-shaped structures are disposed along a second direction.

3. The bipolar junction transistor of claim 2, wherein the first direction is orthogonal to the second direction.

4. The bipolar junction transistor of claim 1, wherein the base region comprises a first portion and a second portion.

5. The bipolar junction transistor of claim 4, further comprising an isolation region between the first portion and the second portion.

6. The bipolar junction transistor of claim 1, further comprising an isolation region between the edge of the emitter region and the edge of the base region.

7. The bipolar junction transistor of claim 1, wherein the base region comprise a rectangular region according to a top view of the bipolar junction transistor.

8. A bipolar junction transistor, comprising:
an emitter region;
a base region; and
a collector region, wherein each of the emitter region, the base region, and the collector region comprises fin-shaped structures, each of the emitter region, the base region, and the collector region comprise a short side and a long side, an edge of the short side of the emitter region is aligned with an edge of the short side of the base region and an edge of the short side of the collector region according to a top view, and the emitter region, the base region, and the collector region are extending along a first direction and the fin-shaped structures are extending along a second direction.

* * * * *